United States Patent [19]

Burnett

[11] Patent Number: 5,021,098
[45] Date of Patent: Jun. 4, 1991

[54] HIGH CONTACT BLIND HOLE THERMOCOUPLE PLUG

[75] Inventor: Donald R. Burnett, Cupertino, Calif.

[73] Assignee: The United States of America as represented by the Secretary of the Navy, Washington, D.C.

[21] Appl. No.: 501,068

[22] Filed: Mar. 28, 1990

[51] Int. Cl.⁵ .......................................... H01L 35/34
[52] U.S. Cl. .................................. 136/201; 136/202; 136/219; 136/233
[58] Field of Search ............... 136/201, 202, 213, 219, 136/238

[56] References Cited

U.S. PATENT DOCUMENTS

| 3,915,002 | 10/1975 | Hance et al. | 73/354 |
| 3,954,507 | 5/1976 | Carter | 136/233 |
| 4,368,234 | 1/1983 | Palmer et al. | 428/408 X |
| 4,762,571 | 8/1988 | Kaufman et al. | 136/234 |
| 4,871,263 | 10/1989 | Wilson | 136/234 X |

OTHER PUBLICATIONS

Delmonte, *Technology of Carbon and Graphite Fiber Composites*, Van Nostrand Reinhold Co., pp. 397-421.

Primary Examiner—Peter A. Nelson
Attorney, Agent, or Firm—Kenneth L. Warsh; Robert M. Wohlfarth

[57] ABSTRACT

It is useful to be able to place a thermocouple in a plug in a spacecraft heat shield without disturbing the heat flow to the thermocouple. The thermocouple wire is ceramic coated before placement in the plug and a thin metal disc is placed in the bottom of the hole. The thermocouple wire is pressed into the disc to obtain good thermal contact.

4 Claims, 1 Drawing Sheet

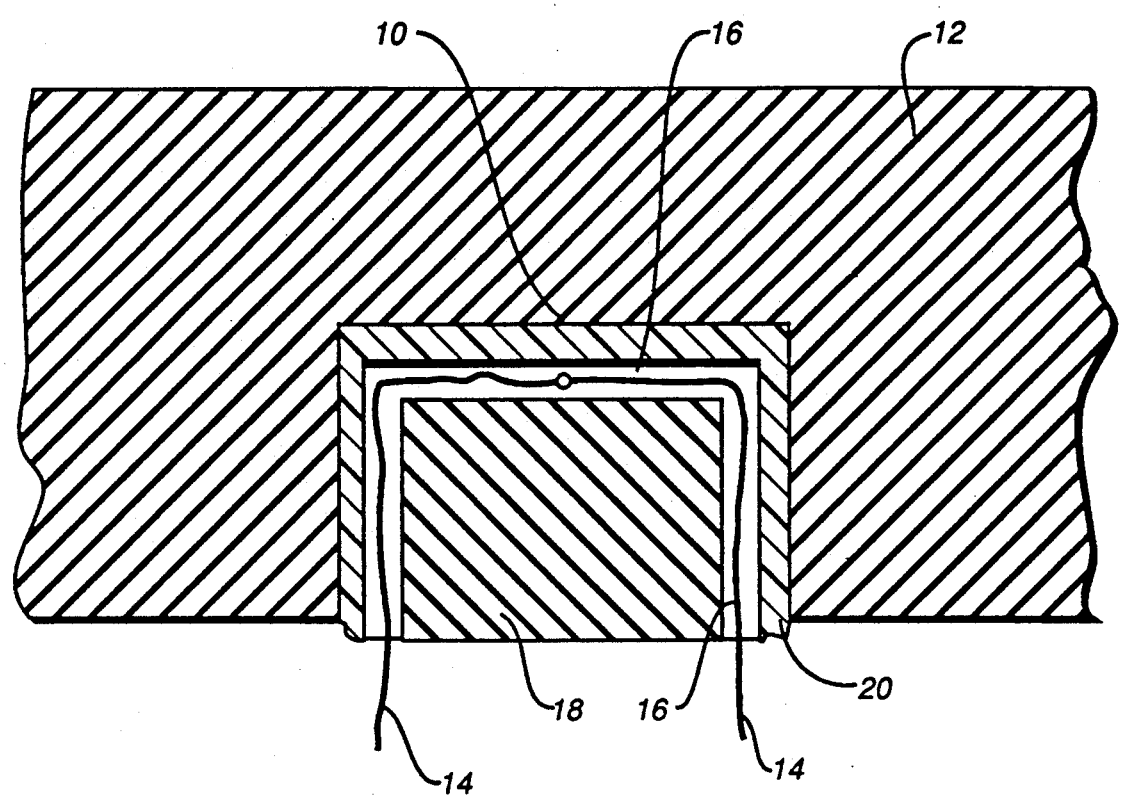
FIG._1
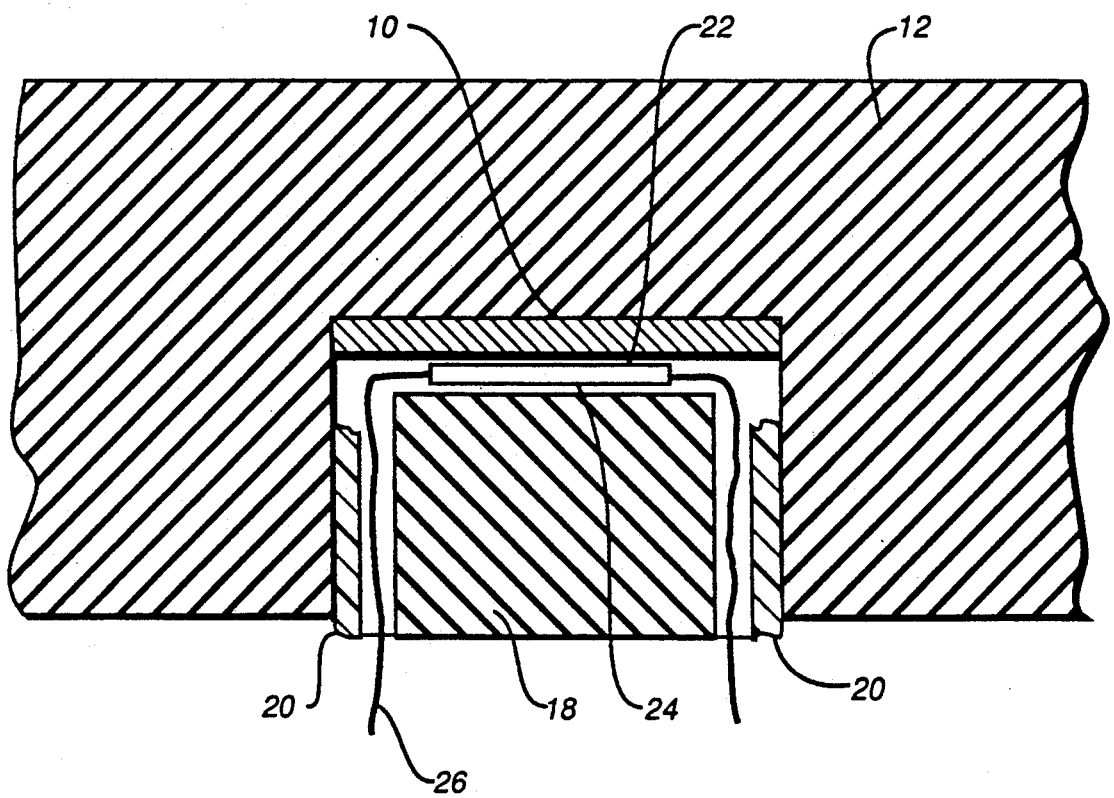
FIG._2

HIGH CONTACT BLIND HOLE THERMOCOUPLE PLUG

FIELD OF THE INVENTION

This invention pertains to a method for mounting a thermocouple in a blind hole in a carbon phenolic heat shield.

BACKGROUND OF THE INVENTION

Spacecraft require heat shields to protect components from atmospheric heating. Temperature measurements within the heat shield are useful during testing. To accomplish such temperature measurements it is desirable to mount thermocouples within the heat shield in blind holes.

Blind hole thermocouple plugs in carbon phenolic heat shields have inaccurately measured temperature due to cutting of the heat conductive fibres in the phenolic by the blind hole resulting in decreased heat flow across the hole. Also epoxy encapsulation of the thermocouple wire in the plug bottom groove has pyrolyzed at re-entry temperatures. The resultant low density char residuum retards heat flow to the thermocouple wire.

OBJECTIVES OF THE INVENTION

It is therefore a primary objective of the present invention to provide a method of forming a blind hole for a thermocouple in a heat shield which does not reduce heat flow to the thermocouple.

SUMMARY OF THE INVENTION

These objects of the invention and other objects, features and advantages to become apparent as the specification progresses are accomplished by the invention according to which, briefly stated, the thermocouple wire is ceramic coated before placement in the plug and a thin metal disc is placed in the bottom of the hole. The thermocouple wire is pressed into the disc to obtain good thermal contact.

LIST OF ADVANTAGES OF THE INVENTION

An important advantage of the present invention is that the thin metal disc provides rapid heat conduction across the hole bottom.

These and further objectives, constructional and operational characteristics, and advantages of the invention will no doubt be more evident to those skilled in the art from the detailed description given hereinafter with reference to the figures of the accompanying drawings which illustrate a preferred embodiment by way of non-limiting example.

BRIEF DESCRIPTION OF THE DRAWINGS

FIG. 1 is a section of the blind hole plug with the thermocouple in the prior art.

FIG. 2 is a section of the high contact blind hole thermocouple plug according to the invention.

GLOSSARY

The following is a glossary of elements and structural members as referenced and employed in the present invention.

10-blind hole
12-carbon phenolic heat shield
14-thermocouple
16-deep groove to hold the thermocouple
18-plug
20-epoxy and powdered carbon phenolic
22-disc of metal foil
24-shallow groove
26-thermocouple insulated with bonded ceramic

DESCRIPTION OF THE PREFERRED EMBODIMENTS

Referring now to the drawings wherein like reference numerals are used to designate like or corresponding parts throughout the various figures thereof, there is shown in FIG. 1 the blind hole plug of the prior art. A blind hole 10 with a flat bottom right angles to the cyclindrical side is formed in the back of the carbon phenolic heat shield 12. The cutting of the fibers of the carbon phenolic heat shield which are thermally conductive obstructs the flow of heat into the plug. This increases the temperature of the material above the plug and reduce the plug's temperature. Therefore, a better design must maximize the flow of heat across this gap and maximize the thermocouple's contact with the material above the plug. Furthermore, in this design the thermocouple 14 is bonded into a groove 16 in the plug 18 with a mixture of epoxy and powered carbon phenolic 20. Groove depths are such that the thermocouple wire is below the end of the plug. The plug is then bonded into the heat shield with epoxy using a maximum bond thickness of 0.005 inches at the end of the plug. There are several inherent drawbacks to this design that can now be seen. The epoxy has a low thermal conductivity and pyrolyzes at temperatures in the 500° F. range leaving a very low density char residual. This will tend to block heat flow. The wire by being buried in a groove is thermally isolated from the heat shield above the plug. The thermal expansion of carbon phenolic reaches a maximum at about 500° F. which could act to cause the material over the plug end to bulge away from the plug if there is a steep temperature gradient in this area. This bulging would further isolate the thermocouple 14 from the heat shield 12 above it.

In the method of the invention, as shown in FIG. 2 a thin disc 22 of a ductile metal foil is placed over the end of the plug 18. Bonding on the plug end is minimized. At most a small amount of cement might be needed to retain the disc 22 on the end of the plug 18. The disc has small perforations to permit the passage of gas during ablation of the heat shield. Copper, gold, or platinum are suitable materials for the disc.

Rather than being buried in the plug 18 the thermocouple is placed in a shallow groove 24 on the end of the plug. The thermocouple is insulated with a bonded ceramic. The groove is sized so that the insulated thermocouple wire 26 will press the disc 22 conforming it to the wire shape and assuring good thermal contact.

The plug could be either spring loaded into the heat shield or bonded in place while a force presses the plug into the hole maximizing the thermal contact. The melting points of the metals specified are above the temperatures expected at the plug depths. The wires should be insulated with a ceramic such as boron nitride which has the desired high electrical resistance and high thermal conductivity.

This invention is not limited to the preferred embodiment and alternatives heretofore described, to which variations and improvements may be made, without departing from the scope of protection of the present patent and true spirit of the invention, the characteristics of which are summarized in the following claims.

What is claimed is:

1. A method of mounting a thermocouple within a a carbon phenolic heat shield, comprising the steps of:
   (a) forming a cylindrical blind hole in the back of a carbon phenolic heat shield, said hole having a flat bottom at a right angle to a cylindrical side,
   (b) forming a cylindrical plug of the same material as the heat shield to fit the hole, said cylindrical plug having flat ends at right angles to a cylindrial side,
   (c) coating a thermocouple with ceramic,
   (d) forming a continuous groove across one end of said plug and the cylindrial side, the depth of said groove on the end being less than the diameter of the ceramic coated thermocouple,
   (e) forming a thin disc of metal to fit the bottom of said hole, said disc having perforation means for passing gasses,
   (f) inserting said thermocouple into said grooves,
   (g) inserting said disc in said hole,
   (h) coating the sides of said plug with glue,
   (i) inserting said plug and thermocouple into said hole with sufficient pressure to force said thermcouple into good contact with said disc, and
   (j) maintaining said pressure until the glue dries.

2. The method of claim 1 wherein said disc is formed of copper.

3. The method of claim 1 wherein said disc is formed of gold.

4. The method of claim 1 wherein said disc is formed of platinum.

* * * * *